US012804838B2

(12) United States Patent
Wang et al.

(10) Patent No.: US 12,804,838 B2

(45) **Date of Patent: *Nov. 17, 2026**

(54) FOLDABLE CONNECTION MECHANISM WITH ARTICULATED LOCKING STRUCTURES AND DISPLAY DEVICE

(71) Applicant: HKC CORPORATION LIMITED, Shenzhen (CN)

(72) Inventors: Hongsong Wang, Shenzhen (CN); Guofei Ji, Shenzhen (CN); Haijiang Yuan, Shenzhen (CN)

(73) Assignee: HKC CORPORATION LIMITED, Shenzhen (CN)

( * ) Notice: Subject to any disclaimer, the term of this patent is extended or adjusted under 35 U.S.C. 154(b) by 242 days.

This patent is subject to a terminal disclaimer.

(21) Appl. No.: 18/672,033

(22) Filed: May 23, 2024

(65) Prior Publication Data

US 2025/0024621 A1 Jan. 16, 2025

(30) Foreign Application Priority Data

Jul. 11, 2023 (CN) ......................... 202310840850.1

(51) Int. Cl.

| | |
|---|---|
| ***H05K 7/00*** | (2006.01) |
| ***H05K 7/02*** | (2006.01) |
| ***H05K 13/00*** | (2006.01) |

(52) U.S. Cl.

CPC ......... *H05K 7/026* (2013.01); *H05K 13/0015* (2013.01)

(58) Field of Classification Search

CPC ...... H05K 7/1417; H05K 7/14; H05K 5/0069; H05K 5/0204; H05K 5/0217; G09F 9/301

See application file for complete search history.

(56) References Cited

U.S. PATENT DOCUMENTS

| | | | | |
|---|---|---|---|---|
| 7,839,656 | B2 * | 11/2010 | Schack | H05K 1/141 361/818 |
| 9,883,604 | B2 * | 1/2018 | Lee | G02F 1/133305 |
| 10,567,880 | B2 * | 2/2020 | Ham | H04R 9/06 |
| 10,635,381 | B2 * | 4/2020 | Nakano | G09F 9/3026 |
| 11,075,477 | B2 * | 7/2021 | Lin | H01R 12/79 |
| 11,404,192 | B2 * | 8/2022 | Lin | G06F 1/16 |
| 11,653,532 | B2 * | 5/2023 | Song | G02F 1/133305 359/461 |

(Continued)

FOREIGN PATENT DOCUMENTS

| | | | |
|---|---|---|---|
| CN | 1641417 | A | 7/2005 |
| CN | 205510533 | U | 8/2016 |

(Continued)

*Primary Examiner* — Rockshana D Chowdhury

(57) ABSTRACT

A connection mechanism and a display device are disclosed. The connection mechanism is used to connect a printed circuit board and a back plate. The connection mechanism includes a connecting device and a securing device. One side of the connecting device is connected to the back plate, and another side is connected to the securing device. The securing device is used to fix up the printed circuit board. The connecting device includes multiple locking structures connected end to end. The multiple locking structures are operative to rotate relative to each other thus driving the securing device to be oriented parallel to the back plate or be folded to a back of the back plate.

18 Claims, 8 Drawing Sheets

(56) References Cited

U.S. PATENT DOCUMENTS 11,706,882 B2* 7/2023 Kim ..................... H05K 5/0217 361/730
11,855,581 B2* 12/2023 Schatz .................... H02S 20/32
11,862,048 B2* 1/2024 Li ........................... G09F 9/301
11,984,052 B2* 5/2024 Wang .................... G09F 9/3026
11,985,782 B2* 5/2024 Yang ....................... G06F 1/183
12,309,947 B2* 5/2025 Liu ........................... G09F 9/30
12,356,565 B2* 7/2025 Yoon ..................... G06F 1/1601
12,389,555 B2* 8/2025 Guo .......................... G09F 9/30
2017/0181304 A1* 6/2017 Lee ................... G02F 1/133305
2020/0012112 A1* 1/2020 Yang ....................... G06F 1/163
2020/0029446 A1* 1/2020 Lei .......................... B66F 11/00
2020/0275562 A1* 8/2020 Jiang ..................... G09F 9/3026
2020/0389987 A1* 12/2020 Kanno ................ G09F 13/0445
2021/0105902 A1* 4/2021 Yoon ..................... G06F 1/1624
2021/0158727 A1* 5/2021 Choi .................... F16M 11/046
2021/0204433 A1* 7/2021 Luo ......................... G09F 9/301
2021/0375164 A1* 12/2021 Liu ....................... G06F 1/1616
2022/0078931 A1* 3/2022 Tian ...................... G06F 1/1652
2022/0102672 A1* 3/2022 Wang ................... H10K 77/111
2022/0198969 A1* 6/2022 Wang .................... G09F 9/3026
2022/0201883 A1* 6/2022 Cho .................. G02F 1/133305
2022/0210928 A1* 6/2022 Kim ...................... G09F 9/3026
2022/0369477 A1* 11/2022 Jo ........................... F16G 13/20
2023/0164936 A1* 5/2023 Kang ................... H05K 5/0217 361/807
2023/0209743 A1* 6/2023 Kim ....................... H04R 1/028 381/388
2023/0217611 A1* 7/2023 Lee ....................... G06F 1/1652 361/807
2023/0225068 A1* 7/2023 Jang ...................... G06F 1/1601 361/807
2023/0269887 A1* 8/2023 Kim ....................... F16M 11/22 361/807
2023/0300973 A1* 9/2023 Zheng .................... H05K 1/028 361/749
2023/0393614 A1* 12/2023 Kim ....................... F16M 11/08
2024/0015896 A1* 1/2024 Wang ................ G02F 1/133308
2024/0032217 A1* 1/2024 Kim ...................... G09F 9/3026
2024/0172369 A1* 5/2024 Kwon ................... G06F 1/1601
2024/0397682 A1* 11/2024 Seo ........................ B60K 35/22
2025/0024621 A1* 1/2025 Wang ................. H05K 13/0015
2025/0024623 A1* 1/2025 Wang ...................... G09F 9/301
2025/0048570 A1* 2/2025 Hwang ............. G02F 1/133308
2025/0089188 A1* 3/2025 Lee .......................... G06F 1/181
2025/0212626 A1* 6/2025 Yang .................... H10K 59/131
2025/0318057 A1* 10/2025 Kim ........................ B60T 8/171
2026/0025936 A1* 1/2026 Li ....................... G02F 1/13452

FOREIGN PATENT DOCUMENTS

CN 207252101 U 4/2018
CN 209356819 U 9/2019
CN 212510372 U 2/2021
CN 213638627 U 7/2021
CN 215068054 U 12/2021
CN 219230587 U 6/2023
JP 2000236154 A 8/2000

* cited by examiner

FOLDABLE CONNECTION MECHANISM WITH ARTICULATED LOCKING STRUCTURES AND DISPLAY DEVICE

CROSS-REFERENCE TO RELATED APPLICATIONS

This application claims the priority and benefit of Chinese patent application number 2023108408501, titled "Connection Mechanism and Display Device" and filed Jul. 11, 2023 with China National Intellectual Property Administration, the entire contents of which are incorporated herein by reference.

TECHNICAL FIELD

This application relates to the field of display, and more particularly relates to a connection mechanism and a display device.

BACKGROUND

The description provided in this section is intended for the mere purpose of providing background information related to the present application but doesn't necessarily constitute prior art.

With the rapid development of display technology, there are many different types of displays on the market, such as flat-screen displays and curved-screen displays. Due to the different designs of the two types, the methods of connecting the printed circuit board to the back plate are also different. In flat-screen displays, the printed circuit board may be connected horizontally to the display panel and the back plate, while in curved-screen displays the printed circuit board may be folded to a back of the back plate for connection.

A connecting device used to connect the printed circuit board to the back plate may only fit one type of display for installation purposes. When assembling the printed circuit board and back plate of different models, different connecting devices need to be replaced for connection, which greatly affects product applicability and increases assembly difficulty and assembly costs.

Therefore, how to switch the mode of connection between the printed circuit board and the back plate in different types of display devices to improve product applicability has become an urgent problem in this field that needs to be solved.

SUMMARY

This application discloses a connection mechanism and a display device, for one purpose of switching the mode of connection between the printed circuit board and the back plate in different types of display devices to improve product applicability.

This application discloses a connection mechanism for connecting a printed circuit board and a back plate. The connection mechanism includes a connecting device and a securing device. One side of the connecting device is connected to the back plate, and the other side is connected to the securing device. The securing device is used to fix up the printed circuit board. The connecting device includes a plurality of locking structures connected end to end. The plurality of locking structures are operative to rotate relative to each other, driving the securing device to be oriented parallel to the back plate or folded to the back of the back plate.

Optionally, the locking structure includes a locking housing and a rotating piece. The rotating piece is arranged in the locking housing. The rotating piece includes a rotating body and a connecting plate. Both the rotating body and the locking housing are cylindrical. One side of the connecting plate is connected to an exterior of the rotating body. The locking structures include a first locking structure and a second locking structure that are adjacently arranged. In the first locking structure, the locking housing defines a first through-slot corresponding to the position of the connecting plate. One side of the connecting plate is connected to an exterior of the rotating body, and the other side extends outward from the first through-slot. The connecting plate in the first locking structure can rotate along a slotting direction of the first through-slot. In the second locking structure, the locking housing further defines a second through-slot corresponding to the position of the connecting plate of the first locking structure. The connecting plate of the first locking structure extends into the second through-slot and is rotatably connected to the locking housing. The connecting plate of the first locking structure can rotate along a slotting direction of the second through-slot.

Optionally, a movable assembly is disposed between the first locking structure and the second locking structure. The movable assembly is arranged in the locking housing of the second locking structure. The movable assembly includes an electromagnet, an elastic piece, and a stopper piece. The electromagnet is arranged adjacent to the connecting plate of the first locking structure. The two ends of the electromagnet each include a rotating shaft. The locking housing defines a rotating shaft hole corresponding to the position of each rotating shaft. Each rotating shaft is inserted into the respective rotating shaft hole so that the electromagnet and the locking housing are rotatably connected. The connecting plate of the first locking structure passes through the second through-slot and is connected to one side of the electromagnet. The other side of the electromagnet is connected to one end of the elastic piece. The other end of the elastic piece is connected to the stopper piece. The stopper piece is magnetic. When the electromagnet is powered off, the electromagnet repels the stopper piece, and the stopper piece is engaged with the rotating body in the second locking structure. When the electromagnet is energized, the electromagnet attracts the stopper piece, and the stopper piece is separated from the rotating body in the second locking structure.

Optionally, the connection mechanism further includes a distance adjusting assembly. One side of the distance adjusting assembly is connected to the back plate, and the other side is connected to the securing device. The distance adjusting assembly includes a connecting rod, a distance adjusting shaft, and a control device. One end of the distance adjusting shaft is connected to the back plate, and the other end is connected to the control device. The distance adjusting shaft is oriented parallel to the securing device. A movable piece is sleeved on the distance adjusting shaft. The control device controls the movable piece to move along a direction of extension of the distance adjusting shaft. The connecting rod is arranged between the distance adjusting shaft and the securing device. One end of the connecting rod is connected to the movable piece, and the other end is connected to the fixed device. The control device is a motor. One end of the distance adjusting shaft is connected to a rotating shaft of the motor. The movable piece is a screw nut.

The motor drives the distance adjusting shaft to rotate and controls the screw nut to move along the direction of extension of the distance adjusting shaft.

Optionally, the connection mechanism further includes a pressing apparatus. The pressing apparatus is mounted on the printed circuit board. The pressing apparatus includes a positioning device, a pressing device, and a guide rail. The positioning device is connected to the side of the guide rail facing towards the printed circuit board. A direction of extension of the guide rail is consistent with a width direction of the flexible cable. The pressing device is sleeved on the guide rail and can move along the direction of extension of the guide rail, and is used to press the junction of the printed circuit board and the flexible cable.

Optionally, the pressing device includes a pressing head assembly and a base. The base is sleeved on the guide rail. The positioning device includes a first positioning piece and a second positioning piece. The first positioning piece and the second positioning piece are respectively arranged on both sides of the guide rail. The second positioning piece is movably connected to the guide rail and can move along the direction of extension of the guide rail. The side of the first positioning piece and the side of the second positioning piece facing away from the guide rail are detachably connected to the printed circuit board, and respectively abut against both sides of the flexible cable in the width direction. The pressing head assembly includes a pressing head, a pressing head rod, and a limiting sleeve. One end of the pressing head rod passes through the limiting sleeve, is connected to the pressing head, and is partially exposed from the limiting sleeve. The side of the limiting sleeve facing away from the base is connected to the pressing head. The pressing head rod can drive the pressing head to reciprocate in a direction perpendicular to the printed circuit board.

Optionally, the connection mechanism further includes a receiving apparatus. The receiving apparatus is connected to the back plate. The receiving apparatus includes a casing and an regulating assembly. The casing has a first opening and a second opening arranged oppositely. The regulating assembly is arranged in the casing. The regulating assembly includes a plurality of regulating pieces, an accommodating structure, and a plurality of first elastic pieces. The accommodating structure is connected to the casing and is used to carry each regulating piece. The plurality of first elastic pieces are arranged at intervals in the casing along the direction from the first opening to the second opening. One end of one of two adjacent first elastic pieces and one end of the other of the two adjacent first elastic pieces are respectively connected to two opposite side walls of the casing. The other end of each first elastic piece is connected to the respective regulating piece. The elastic extension and compression orientation of each first elastic piece is perpendicular to the respective regulating piece. The first elastic piece drives the regulating piece to be movable along the elastic extension and compression orientation of the first elastic piece, and the plurality of regulating pieces are staggered along the direction of the first opening toward the second opening. The flexible cable passes through the side of each of the two adjacent regulating pieces facing away from the respective first elastic piece in sequence, and the two ends of the flexible cable extend outward from the first opening and the second opening respectively.

Optionally, each regulating piece is a tubular structure. The side wall of the casing includes a first side wall and a second side wall opposite to each other. The first side wall and the second side wall are respectively located on both sides of the regulating piece in the length. The first side wall includes a plurality of first slide groove that are disposed at intervals in a direction from the first opening to the second opening. The second side wall includes a plurality of second slide groove that are disposed at intervals in a direction from the first opening to the second opening. The positions of the first slide grooves are in one-to-one correspondence with the positions of the second slide grooves. The first slide grooves and the second slide grooves are both elongated. A direction of extension of each first slide groove and each second slide groove is identical with the elastic extension and compression orientation of the first elastic piece. The accommodating structure includes a plurality of bearings. Both ends of each bearing are respectively embedded in the first slide groove and the second slide groove arranged on the same layer, and the bearing can move along the direction of extension of the first slide groove and the second slide groove. Each regulating piece is sleeved on the respective bearing.

Optionally, the securing device includes a first clamping plate and a second clamping plate. The first clamping plate and the second clamping plate are arranged at intervals. The first clamping plate and the second clamping plate clamp the printed circuit board from both sides in the width direction of the printed circuit board.

This application further discloses a display device, including a display panel, a back plate, a printed circuit board, and a flexible cable. The back plate wraps up the display panel. One side of the flexible cable is connected to the display panel, and the other side is connected to the printed circuit board. The display device further includes the above-mentioned connection mechanism. The connection mechanism connects the printed circuit board to the back plate and the display panel.

This application improves the connection mechanism for connecting the printed circuit board and the back plate. First, the printed circuit board is fixed to the connection mechanism using the securing device in the connection mechanism to prevent the printed circuit board from shaking thus ensuring the stability of the connection of the printed circuit board. Then the printed circuit board is connected to in the back plate through the connecting device. The connecting device is of a chain structure formed by connecting multiple locking structures end to end. The multiple locking structures are operative to rotate relative to each other so that the position of the entire connecting device relative to the back plate can be adjusted. Thus, depending on different types of the display device, the securing device can be driven to be oriented parallel to the back plate or folded to the back of the back plate.

BRIEF DESCRIPTION OF DRAWINGS

The accompanying drawings are used to provide a further understanding of the embodiments according to the present application, and constitute a part of the specification. They are used to illustrate the embodiments according to the present application, and explain the principle of the present application in conjunction with the text description. Apparently, the drawings in the following description merely represent some embodiments of the present disclosure, and for those having ordinary skill in the art, other drawings may also be obtained based on these drawings without investing creative efforts. A brief description of the accompanying drawings is provided as follows.

Figure 1:
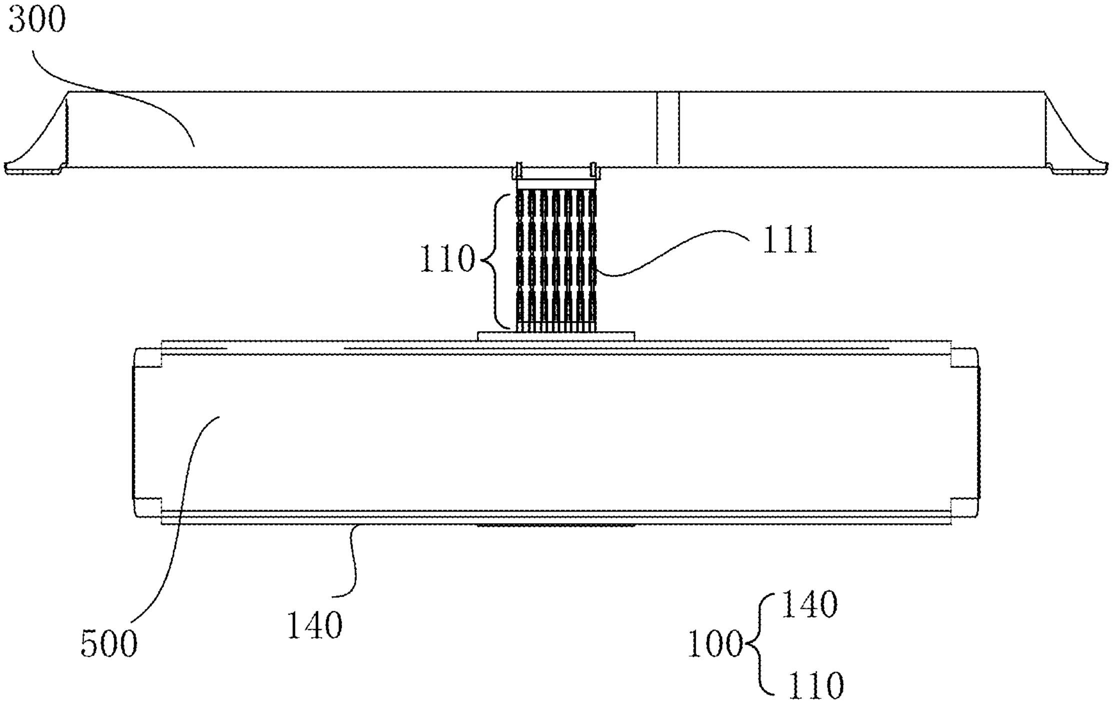
FIG. 1 is a schematic diagram of a first embodiment of a connection mechanism according to the present application.

In the drawings: 10. Display device; 100. Connection mechanism; 110. Connecting device; 111. Locking structure; 112. locking housing; 113. First through-slot; 114. Second through-slot; 115. Rotating shaft hole; 116. Slide groove; 117. Rotating piece; 118. Rotating body; 119. Engaging teeth; 120. Connecting plate; 121. First locking structure; 122. Second locking structure; 130. Movable assembly; 131. Electromagnet; 132. Rotating shaft; 133. Elastic piece; 134. Stopper piece; 135. Fixing teeth; 136. Protruding bar; 140. Securing device; 141. First clamping plate; 142. Second clamping plate; 150. Distance adjusting assembly; 151. Connecting rod; 152. Distance adjusting shaft; 153. Control device; 154. Motor; 155. Movable piece; 156. Screw nut; 160. Pressing apparatus; 161. Positioning device; 162. First positioning piece; 163. Second positioning piece; 164. Pressing device; 165. Pressing head assembly; 166. Pressing head; 167. Pressing head rod; 168. Rack teeth; 169. Limiting sleeve; 170. Base; 171. Storage cavity; 172. First motor; 173. First electric gear; 174. Second motor; 175. Second electric gear; 176. Guide rail; 180. Receiving apparatus; 181. Casing; 182. Top wall; 183. Bottom wall; 184. Side wall; 185. First side wall; 186. First slide groove; 187. Second side wall; 188. Second slide groove; 189. First opening; 190. Second opening; 191. Regulating assembly; 192. Regulating piece; 193. Accommodating structure; 194. Bearing; 195. First elastic piece; 200. Display panel; 300. Back plate; 400. Flexible cable; 500. Printed circuit board; 210. Fixing piece; 220. First shaft hole; 177. Suction cup.

DETAILED DESCRIPTION OF EMBODIMENTS

This application will be described in detail below with reference to the accompanying drawings and optional embodiments. It should be noted that, should no conflict is present, the various embodiments or technical features described below can be combined arbitrarily to form new embodiments.

Figure 2:
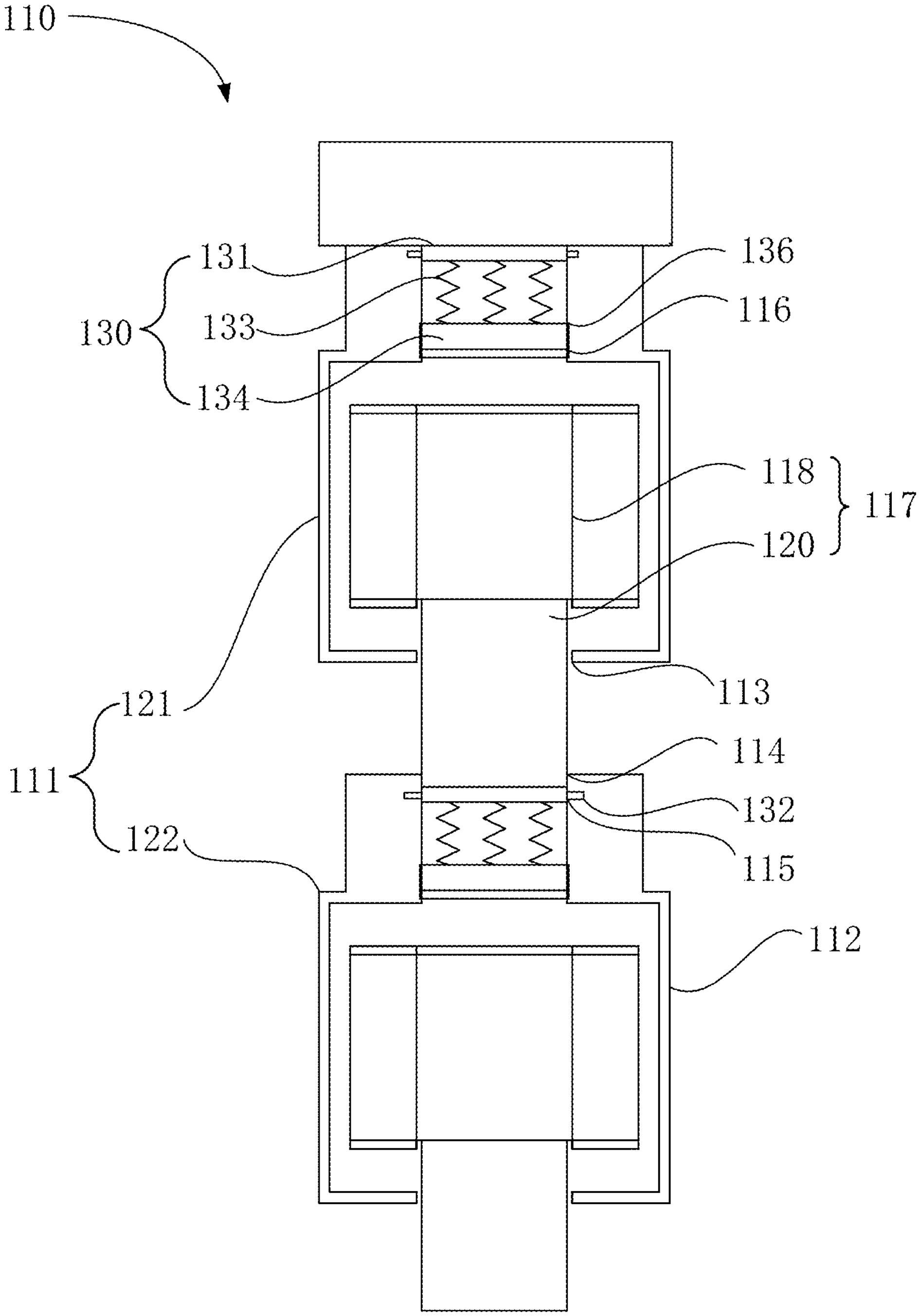
FIG. 2 is a schematic diagram of a connecting device in the first embodiment of the connection mechanism according to the present application.
Figure 3:
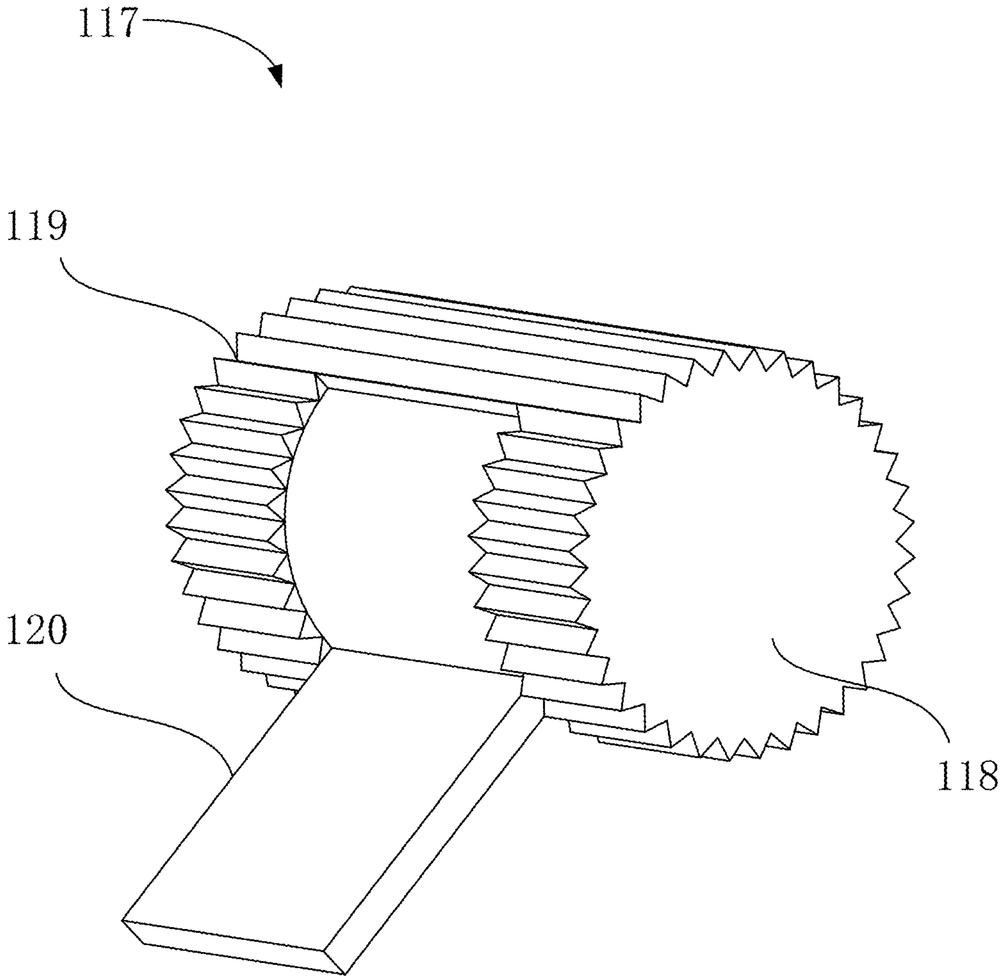
FIG. 3 is a schematic diagram of a rotating piece in the first embodiment of the connection mechanism according to the present application.
Figure 4:
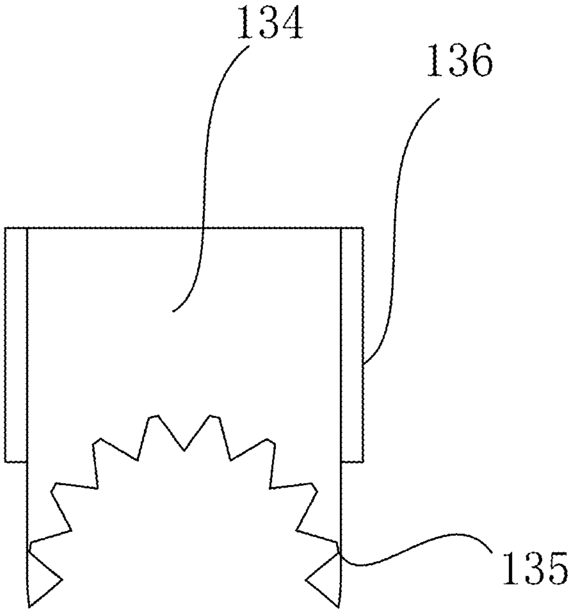
FIG. 4 is a schematic diagram of a stopper piece in the first embodiment of the connection mechanism according to the present application.
Figure 5:
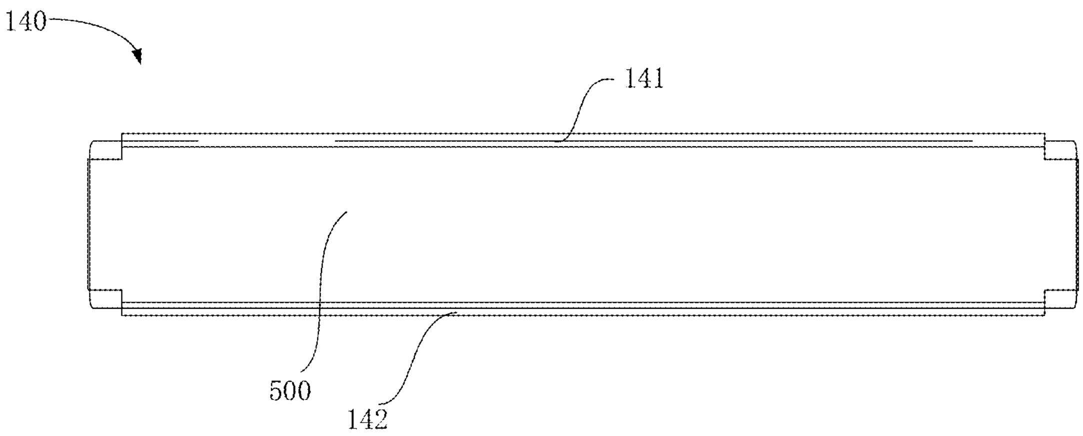
FIG. 5 is a schematic diagram of a securing device in the first embodiment of the connection mechanism according to the present application.

FIG. 1 is a schematic diagram of a first embodiment of a connection mechanism according to the present application. FIG. 2 is a schematic diagram of a connecting device in the first embodiment of the connection mechanism according to the present application. FIG. 3 is a schematic diagram of a rotating piece in the first embodiment of the connection mechanism according to the present application. FIG. 4 is a schematic diagram of a stopper piece in the first embodiment of the connection mechanism according to the present application. FIG. 5 is a schematic diagram of a securing device in the first embodiment of the connection mechanism according to the present application. As illustrated in FIG. 1, this application discloses a connection mechanism 100 for connecting a printed circuit board 500 and a back plate 300. The connection mechanism 100 includes a connecting device 110 and a securing device 140. One side of the connecting device 110 is connected to the back plate 300 and the other side is connected to the securing device 140. The securing device 140 is used to fix up the printed circuit board 500. The connecting device 110 includes a plurality of locking structures 111 connected end to end. The plurality of locking structures 111 are operative to rotate relative to each other, driving the securing device 140 to be oriented parallel to the back plate 300 or folded to a back of the back plate 300.

This application improves the connection mechanism 100 for connecting the printed circuit board 500 and the back plate 300. First, the printed circuit board 500 is fixed to the connection mechanism 100 using the securing device 140 in the connection mechanism 100 to prevent the printed circuit board 500 from shaking thus ensuring the stability of the connection of the printed circuit board 500. Then the printed circuit board 500 is connected to the back plate 300 through the connecting device 110. The connecting device 110 is of a chain structure formed by connecting multiple locking structures 111 end to end. The multiple locking structures 111 are operative to rotate relative to each other so that the position of the entire connecting device 110 relative to the back plate 300 can be adjusted. Thus, depending on different types of the display device 10, the securing device 140 can be driven to be oriented parallel to the back plate 300 or folded to the back of the back plate 300.

In particular, as illustrated in FIG. 2, each locking structure 111 includes a locking housing 112 and a rotating piece 117. The rotating piece 117 is arranged in the locking housing 112. The rotating piece 117 includes a rotating body 118 and a connecting plate 120. Both the rotating body 118 and the locking housing 112 are cylindrical. One side of the connecting plate 120 is connected to the exterior of the rotating body 118. The locking structure 111 includes a first locking structure 121 and a second locking structure 122 that are arranged adjacently. In the first locking structure 121, the locking housing 112 includes a first through-slot 113 at a position corresponding to the connecting plate 120. One side of the connecting plate 120 is connected to the exterior of the rotating body 118, and the other side of the connecting plate 120 extends outward from the first through-slot 113. The connecting plate 120 in the first locking structure 121 may rotate along a slotting direction of the first through-slot 113, and an angle of rotation of the connecting plate 120 is greater than or equal to 90°. In the second locking structure 122, the locking housing 112 further defines a second through-slot 114 at a position corresponding to the connecting plate 120 of the first locking structure 121. The connecting plate 120 of the first locking structure 121 extends into the second through-slot 114 and is rotatably connected to the locking housing 112. The connecting plate 120 of the first locking structure 121 can rotate along a slotting direction of the second through-slot 114, and the connecting plate 120 of the first locking structure 121 rotates at an angle greater than or equal to 90° in the second through-slot 114.

Since the locking housing 112 and the rotating body 118 located in the locking housing 112 in this application are both cylindrical, the rotating body 118 can rotate relative to the locking housing 112 in the locking housing 112. When the rotating body 118 rotates, it will drive the connecting plate 120 to rotate. The range of rotation of the connecting plate 120 and the rotating body 118 depends on the size of the first through-slot 113 and the second through-slot 114. When the connecting plate 120 in the first locking structure 121 extends out of the first through-slot 113 and extends into the second through-slot 114 in the locking housing 112 of the second locking structure 122 and is connected to the locking housing 112 of the second locking structure 122, the connecting plate 120 of the first locking structure 121 not only connects two adjacent locking structures 111, but also enables the two adjacent locking structures 111 to rotate relative to each other through the connecting plate 120. When the connecting plate 120 between two adjacent locking structures 111 is operative to rotate at an angle greater than or equal to 90°, after the plurality of locking structures 111 rotate together, the entire connecting device 110 can be more easily folded to the back of the back plate 300 or kept parallel with the back plate 300.

Further, a movable assembly 130 is disposed between the first locking structure 121 and the second locking structure 122. The movable assembly 130 is disposed in the locking housing 112 of the second locking structure 122. The movable assembly 130 includes an electromagnet 131, an elastic piece 133, and a stopper piece 134. The electromagnet 131 is arranged adjacent to the connecting plate 120 of the first locking structure 121. The two ends of the electromagnet 131 each include a rotating shaft 132. The locking housing 112 defines a rotating shaft hole 115 at a position corresponding to each rotating shaft 132. Each rotating shaft 132 is inserted into the respective rotating shaft hole 115 to rotatably connect the electromagnet 131 and the locking housing 112. The connecting plate 120 of the first locking structure 121 passes through the second through-slot 114 and is connected to one side of the electromagnet 131. The other side of the electromagnet 131 is connected to one end of the elastic piece 133. The other end of the elastic piece 133 is connected to the stopper piece 134. The stopper piece 134 is magnetic. A plurality of fixing teeth 135 are arranged on the side of the stopper piece 134 facing away from the elastic piece 133. The outer surface of the rotating body 118 of the first locking structure 121 and the outer surface of the rotating body of the second locking structure 122 each include a plurality of engaging teeth 119. The fixing teeth 135 are operative to be engaged with the engaging teeth 119. When the electromagnet 131 is powered off, the fixing teeth 135 engage with the engaging teeth 119 of the rotating body 118 in the second locking structure 122. When the electromagnet 131 is energized, the electromagnet 131 attracts the stopper piece 134, and the fixing teeth 135 disengage from the engaging teeth 119 of the rotating body 118 in the second locking structure 122.

In the adjacently arranged first locking structure 121 and second locking structure 122, the connecting plate 120 of the first locking structure 121 is connected to the electromagnet 131 in the locking housing 112 of the second locking structure 122, and the electromagnet 131 is connected to the rotating shaft holes 115 in the locking housing 112 of the second locking structure 122 through the rotating shafts 132, thus realizing the rotatable connection between the connecting plate 120 of the first locking structure 121 and the second locking structure 122.

Furthermore, this application uses the movable assembly 130 between the first locking structure 121 and the second locking structure 122 to control the relative rotation and locking of the two adjacent locking structures 111. When the position of the printed circuit board 500 needs to be adjusted, the movable assembly 130 is used to make the two adjacent locking structures 111 relatively rotatable. When the printed circuit board 500 needs to be fixed up, the movable assembly 130 is used to lock up the two adjacent locking structures 111 to prevent the locking structures 111 from relatively rotating.

In addition, a power supply may be disposed in the connection mechanism 100 or on the back plate 300 to provide power to the electromagnet 131 and control the electromagnet 131 to produce electromagnetism. The specific working principle is as follows. When the electromagnet 131 is energized, an attractive force is produced between the electromagnet 131 and the stopper piece 134. Accordingly, the stopper piece 134 is attracted by the electromagnet 131 and moves toward the electromagnet 131. During the movement of the stopper piece 134, the elastic piece 133 is compressed by the stopper piece 134. As such, the fixing teeth 135 of the stopper piece 134 are disengaged from the engaging teeth 119 of the rotating body 118 in the second locking structure 122, and so the first locking structure 121 and the second locking structure 122 are operative to rotate relative to each other. Furthermore, by rotating the plurality of locking structures 111 relative to each other, the relative position between the entire connecting device 110 and the back plate 300 may be adjusted. When the electromagnet 131 is powered off, there is no attractive force between the electromagnet 131 and the stopper piece 134. At this time, the compressed elastic piece 133 may release its amount of compression and push the stopper piece 134 in the direction away from the electromagnet 131 until the fixing teeth 135 of the stopper piece 134 engage with the engaging teeth 119 of the rotating body 118 in the second locking structure 122, so that the first locking structure 121 and the second locking structure 122 are locked up to achieve a final fixed form, so that the printed circuit board 500 is connected through the connecting device 110.

The stopper piece 134 includes a protruding bar 136 on each of both sides. The locking housing 112 includes a slide groove 116 at a position corresponding to each protruding bar 136. Each protruding bar 136 is embedded in the respective slide groove 116 and may slide in a direction of extension of the slide groove 116.

When the electromagnet 131 is energized, an attractive force is produced between the electromagnet 131 and the stopper piece 134. The stopper piece 134 uses the protruding bars 136 on both sides to move along the slide grooves 116 in a direction of approaching the electromagnet 131 and leaving away from the rotating body 118 in the second locking structure 122. When the electromagnet 131 is powered off, there is no attractive force between the electromagnet 131 and the stopper piece 134. At this time, the compressed elastic piece 133 will release its amount of compression and push the stopper piece 134 away from the electromagnet 131. At this time, the protruding bars 136 on both sides of the stopper piece 134 move along the slide grooves 116 in the direction away from the electromagnet 131. The cooperation between the slide grooves 116 and the protruding bars 136 is used to limit the moving path of the stopper piece 134, so that the stopper piece 134 moves more stably in the locking housing 112 and is less prone to position deviation.

Further, as illustrated in FIG. 5, the securing device 140 includes a first clamping plate 141 and a second clamping plate 142. The first clamping plate 141 and the second clamping plate 142 are spaced apart. The first clamping plate 141 and the second clamping plate 142 clamp the printed circuit board 500 from both sides in a width of the printed circuit board 500.

When assembling the printed circuit board 500 and the securing device 140, it is merely needed to embed the printed circuit board 500 between the first clamping plate 141 and the second clamping plate 142 so that the first clamping plate 141 and the second clamping plate 142 clamp the printed circuit board 500 from both sides in the width of the printed circuit board 500, thereby completing the installation of the printed circuit board 500 and the securing device 140, hence simple and convenient installation and easy replacement of the printed circuit board 500. Furthermore, the printed circuit board 500 is not easily detached from the securing device 140 by means of clamping and fixing, which further improves the fixing stability of the printed circuit board 500.

Figure 6:
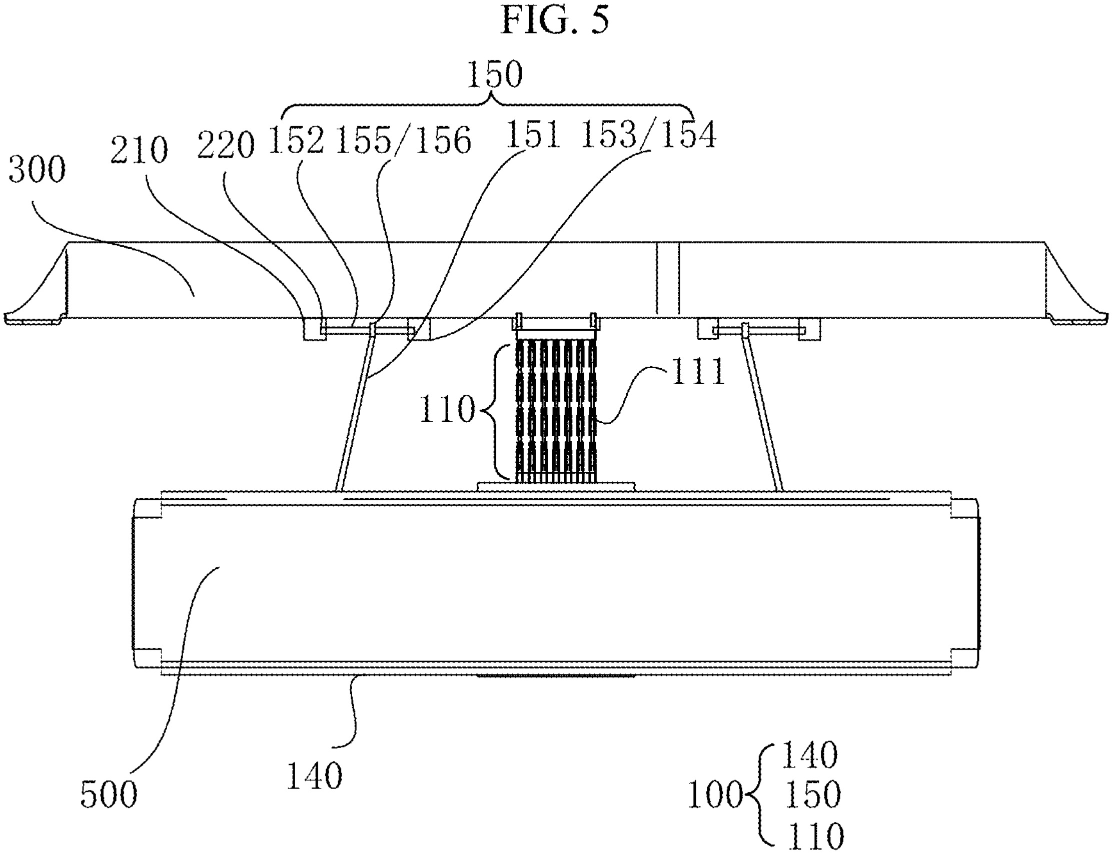
FIG. 6 is a schematic diagram of a second embodiment of the connection mechanism according to the present application.

FIG. 6 is a schematic diagram of a second embodiment of the connection mechanism according to the present application. As illustrated in FIG. 6, the connection mechanism 100 further includes a distance adjusting assembly 150. One side of the distance adjusting assembly 150 is connected to the back plate 300, and the other side of the distance adjusting assembly 150 is connected to the securing device 140. The distance adjusting assembly 150 includes a connecting rod 151, a distance adjusting shaft 152, and a control device 153. One end of the distance adjusting shaft 152 is connected to the back plate 300, and the other end is connected to the control device 153. The distance adjusting shaft 152 is disposed parallel to the securing device 140. The distance adjusting shaft 152 includes a movable piece 155. The control device 153 controls the movable piece 155 to move along a direction of extension of the distance adjusting shaft 152. The connecting rod 151 is arranged between the distance adjusting shaft 152 and the securing device 140. One end of the connecting rod 151 is connected to the movable piece 155, and the other end of the connecting rod 151 is connected to the fixed device 140. The control device 153 may be a motor 154. One end of the distance adjusting shaft 152 is connected to a rotating shaft of the motor 154. The movable piece 155 is a screw nut 156. The motor 154 drives the distance adjusting shaft 152 to rotate and accordingly controls the screw nut 156 to move along the direction of extension of the distance adjusting shaft 152.

The difference between this embodiment and the embodiment shown in FIG. 1 lies in that in this embodiment an additional distance adjusting assembly 150 is added between the back plate 300 and the securing device 140. When the printed circuit board 500 is adjusted to be installed parallel with the back plate 300, the distance between the printed circuit board 500 and the back plate 300 may be adjusted through the distance adjusting assembly 150.

For flat screen models, it is necessary to adjust the distance between the printed circuit board 500 and the back plate 300 through the distance adjusting assembly 150 to prevent the printed circuit board 500 from abutting on the back plate 300 causing leakage of electricity, and avoid incorrect distance between the back plate 300 and the printed circuit board 500 which may cause the glass substrates of the display panel 200 to be damaged due to collision during alignment, or avoid problems such as warping caused by the printed circuit board 500 abutting against the back plate 300. Furthermore, when the distance adjusting assembly 150 in this application is operating, the locking structure 111 may operate in conjunction, which makes it easier to adjust the printed circuit board 500 and the back plate 300 to obtain a suitable distance.

First, the printed circuit board 500 is fixed to the connection mechanism 100 using the securing device 140 to prevent the printed circuit board 500 from shaking resulting in positional deviation. Then the printed circuit board 500 and the back plate 300 are connected through the distance adjusting assembly 150 of the connection mechanism 100. Then the distance adjusting assembly 150 is used to adjust the distance between the securing device 140 and the back plate 300. Driven by the control device 153, the movable piece 155 in the distance adjusting assembly 150 may move horizontally along the distance adjusting shaft 152, and one end of the connecting rod 151 in the distance adjusting assembly 150 is connected to the movable piece 155. Therefore, this end of the connecting rod 151 may move along with the movement of the movable piece 155, while the other end of the connecting rod 151 is connected to the fixed device 140 and will not move. Thus, during the movement of the movable piece 155, the entire connecting rod 151 may rotate axially between the back plate 300 and the securing device 140 and gradually tilt. The movement of the movable piece 155 in different directions on the distance adjusting shaft 152 causes the connecting rod 151 to tilt in different directions, thus gradually shortening or enlarging the distance between the back plate 300 and the securing device 140. In this way, the distance between the printed circuit board 500 and the back plate 300 may be flexibly adjusted to prevent the printed circuit board 500 from colliding with the back plate 300 thus causing leakage of electricity.

In particular, the control device 153 may be a motor 154. One end of the distance adjusting shaft 152 is connected to a rotating shaft 132 of the motor 154. The movable piece 155 may be a screw nut 156. The motor 154 drives the distance adjusting shaft 152 to rotate and accordingly controls the screw nut 156 to move along a direction of extension of the distance adjusting shaft 152.

A fixing piece 210 may be disposed on the side of the back plate 300 facing towards the securing device 140. A first rotating shaft hole 220 may be defined in the fixing piece 210. A direction of extension of the first rotating shaft hole 220 may be parallel to the securing device 140. One end of the distance adjusting shaft 152 may be horizontally inserted into the first shaft hole 220, so that one end of the distance adjusting shaft 152 is rotatable in the first shaft hole 220, and the other end of the distance adjusting shaft 152 is connected to the rotating shaft of the motor 154.

When the motor 154 is started, the rotating shaft of the motor 154 drives the distance adjusting shaft 152 to rotate. The forward or reverse rotation of the motor 154 drives the forward or reverse rotation of the distance adjusting shaft 152, thereby driving the screw nut 156 to move left or right on the distance adjusting shaft 152. Since one end of the connecting rod 151 is connected to the screw nut 156, when the screw nut 156 moves, this end of the connecting rod 151 connected to the screw nut 156 may also move with the screw nut 156. The other end of the connecting rod 151 is connected to the securing device 140 and will not move relative to the securing device 140. This causes the connecting rod 151 to rotate axially and tilt due to the drive of the screw nut. When the motor 154 rotates forward or reverse to drive the screw nut 156 to move left or right, the connecting rod 151 will tilt in different directions thus shortening or increasing the distance between the back plate 300 and the securing device 140, thereby adjusting the distance between the back plate 300 and the printed circuit board 500.

The distance between the securing device 140 and the back plate 300 ranges from 0.5 mm to 2 mm. When the distance between the securing device 140 and the back plate 300 is less than 0.5 mm, collisions may easily occur between the back plate 300 and the printed circuit board 500, and so current leakage problems may easily occur. When the distance between the securing device 140 and the back plate 300 is greater than 2 mm, the overall layout space is not compact enough, which affects the space utilization of the display device 10 and is not conducive to the thinning and lightness of the display device 10. Therefore, the distance between the securing device 140 and the back plate 300 ranges from 0.5 mm to 2 mm, which may be 1 mm. This not only effectively prevents collision between the back plate 300 and the printed circuit board 500, but also makes the overall layout more compact.

Figure 7:
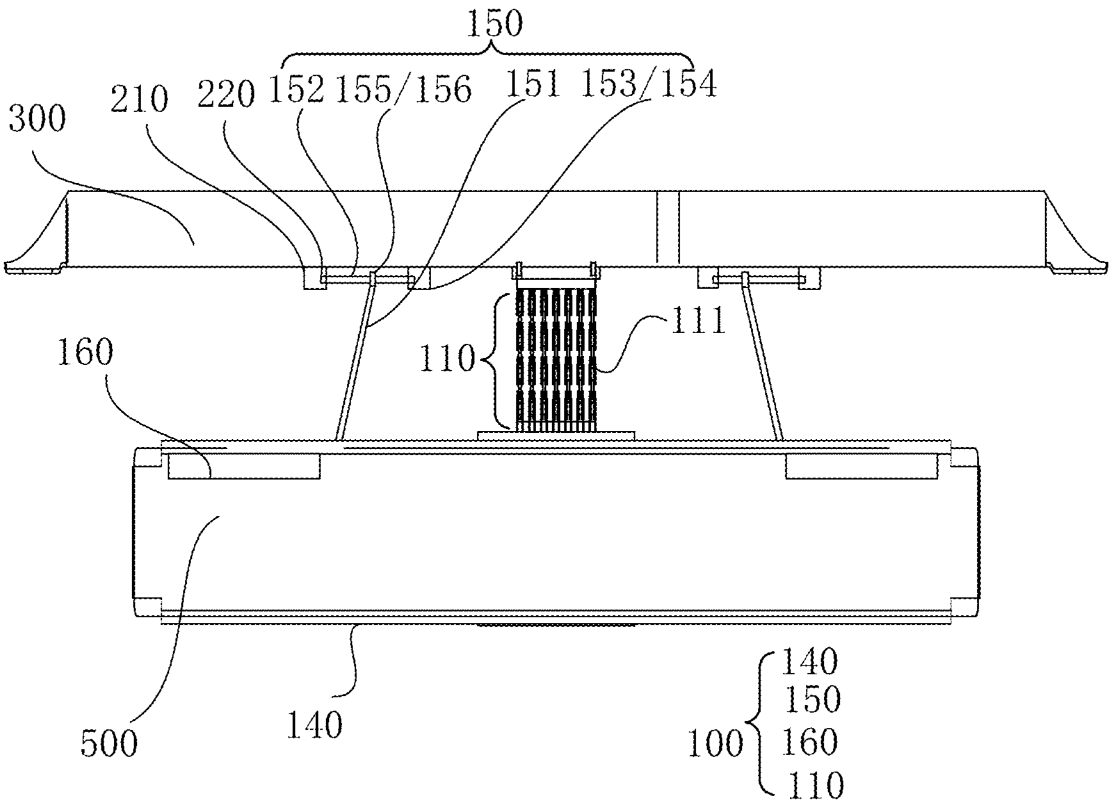
FIG. 7 is a schematic diagram of a third embodiment of the connection mechanism according to the present application.
Figure 8:
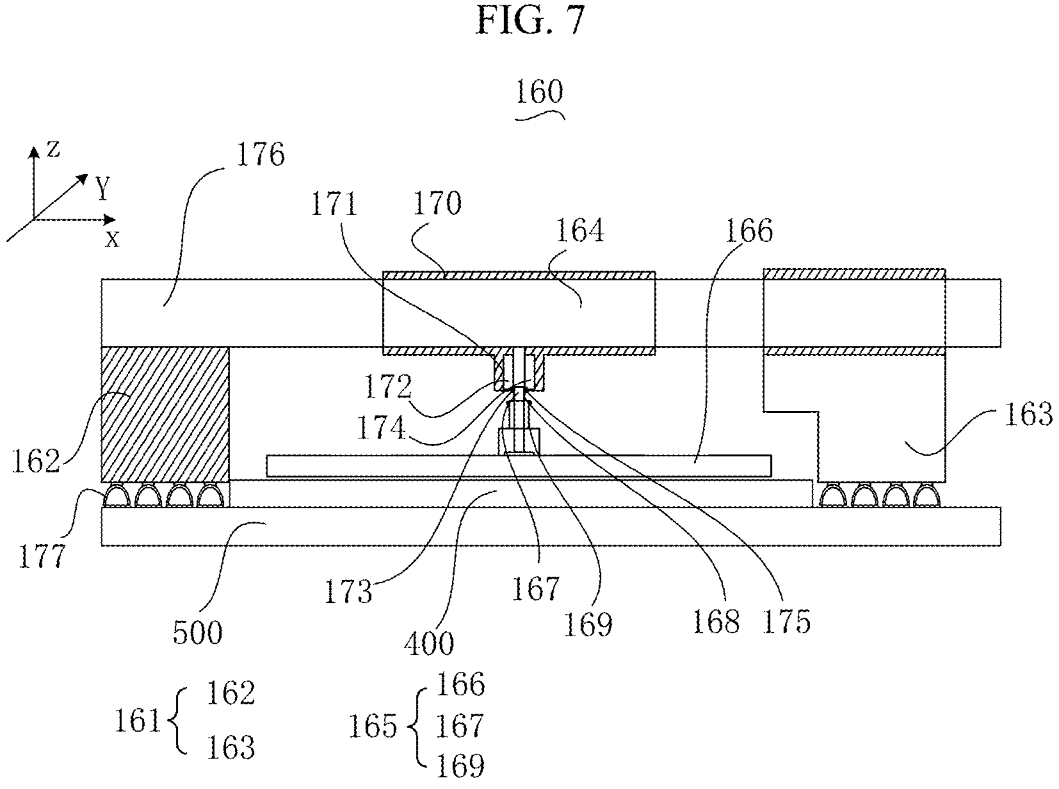
FIG. 8 is a schematic diagram of a pressing apparatus in the third embodiment of the connection mechanism according to the present application.

FIG. 7 is a schematic diagram of a third embodiment of the connection mechanism according to the present application. FIG. 8 is a schematic diagram of a pressing device in the third embodiment of the connection mechanism according to the present application. The connection mechanism 100 further includes a pressing apparatus 160. The pressing apparatus 160 is mounted on the printed circuit board 500. The pressing apparatus 160 includes a positioning device 161, a pressing device 164, and a guide rail 176. The positioning device 161 is connected to a side of the guide rail 176 facing towards the printed circuit board 500. A direction of extension of the guide rail 176 is consistent with a width direction of a flexible cable 400. The pressing device 164 is sleeved on the guide rail 176 and can move along the direction of extension of the guide rail 176 for pressing the junction of the printed circuit board 500 and the flexible cable 400.

During the switching process, the pressing device 164 may be used to adjust the width of the junction between the flexible cable 400 and the printed circuit board 500 that is to be pressed so that the flexible cables 400 with different widths may be replaced for adaptation. In this way, it can adapt to the junction of the printed circuit board 500 and the back plate 300 in different display models without affecting the connection between the flexible cable 400 of different widths and the printed circuit board 500, thereby improving product applicability.

As illustrated in FIG. 8, the pressing device 164 includes a pressing head assembly 165 and a base 170. The base 170 is sleeved on the guide rail 176. A storage cavity 171 is defined in the side of the base 170 facing towards the printed circuit board 500. A first motor 172 and a second motor 174 that are spaced apart along the horizontal direction are disposed in the storage cavity 171. The positioning device 161 includes a first positioning piece 162 and a second positioning piece 163. The first positioning piece 162 and the second positioning piece 163 are respectively disposed on both sides of the pressing device 164. The second positioning piece 163 is movably connected to the guide rail 176 and can move along the direction of extension of the guide rail 176. The first positioning piece 162 and the second positioning piece 163 are detachably connected to the printed circuit board 500 and respectively abut against both sides of the flexible cable 400 in the width direction. The pressing head assembly 165 includes a pressing head 166, a pressing head rod 167, and a limiting sleeve 169. One end of the pressing head rod 167 passes through the limiting sleeve 169, is connected to the pressing head 166, and is partially exposed from the limiting sleeve 169. The side of the limiting sleeve 169 away from the base 170 is connected to the pressing head 166. The pressing head rod 167 can drive the pressing head 166 to reciprocate in a direction perpendicular to the printed circuit board 500.

The pressing head rod 167 is disposed between the first motor 172 and the second motor 174. The first motor 172 includes a first electric gear 173. The second motor 174 includes a second electric gear 175. The portion of the pressing head rod 167 that is exposed from the limiting sleeve 169 includes a plurality of rack teeth 168 on the side walls 184 facing towards the first motor 172 and the second motor 174. The plurality of rack teeth 168 are respectively connected to the first electric gear 173 and the second electric gear 175. The first motor 172 and the second motor 174 are operative to rotate forward or reverse to control a rise or fall of the pressing head rod 167. A width of the limiting sleeve 169 is greater than a distance between the first motor 172 and the second motor 174. The height of the portion of the pressing head rod 167 that is exposed from the limiting sleeve 169 is equal to a thickness of the flexible cable 400.

The pressing apparatus 160 of the present application uses the pressing device 164 to vertically press the junction of the printed circuit board 500 and the flexible cable 400, so that the flexible cable 400 and the printed circuit board 500 can be stably connected together and not easy to fall apart, thus maintaining good signal transmission. Furthermore, the first positioning piece 162 and the second positioning piece 163 are used to horizontally abut on the flexible cable 400 from both sides in the width direction, so that the flexible cable 400 can be accurately positioned at the connection position with the printed circuit board 500, and positional deviation is not likely to occur, further improving the stability of the connection between the flexible cable 400 and the printed circuit board 500. Both the pressing device 164 and the second positioning piece 163 in this application can move along the guide rail 176, so that the positions of the pressing device 164 and the second positioning piece 163 can be adjusted adaptively depending on the width of the flexible cable 400 of different specifications so as to adjust the pressing range of the pressing apparatus 160, and so the first positioning piece 162 and the second positioning piece 163 can press against the flexible cables 400 of different widths from the horizontal direction. Furthermore, the pressing device 164 may be accurately aligned with the junction of the flexible cable 400 of different widths and the printed circuit board 500, and press it in the vertical direction, so that the flexible cable 400 and the printed circuit board 500 are stably connected together, ensuring signal transmission and improving the applicability of the pressing apparatus 160.

After the position of the flexible cable 400 is limited in the horizontal direction through the first positioning piece 162 and the second positioning piece 163, the pressing device 164 may be used to press the flexible cable 400 in the vertical direction. When the flexible cable 400 needs to be pressed, the first motor 172 and the second motor 174 may be controlled to rotate forward, so that the rotating shaft 132 of the first motor 172 drives the first electric gear 173 to rotate, and the rotating shaft 132 of the second motor 174 drives the second electric gear 175 to rotate. When the first electric gear 173 and the second electric gear 175 rotate simultaneously, the pressing head rod 167 is driven to move downward. At this time, the pressing head 166 connected to the side of the pressing head rod 167 facing towards the printed circuit board 500 moves downward together with the pressing head rod 167 until it abuts on the flexible cable 400 and presses the junction of the flexible cable 400 and the printed circuit board 500, so that the port pins of the flexible cable 400 and the pins of the printed circuit board 500 are connected to realize stable signal conduction. When the flexible cable 400 needs to be replaced and removed from the printed circuit board 500, the first motor 172 and the second motor 174 may be controlled to rotate in a reverse direction, so that the rotating shaft 132 of the first motor 172 drives the first electric gear 173 to rotate in the reverse direction, and the rotating shaft 132 of the second motor 174 drives the second electric gear 175 to rotate in the opposite direction. When the first electric gear 173 and the second electric gear 175 rotate simultaneously, the pressing head rod 167 is driven to move upward. At this time, the pressing head 166 connected to the side of the pressing head rod 167 facing towards the printed circuit board 500 moves upward together with the pressing head rod 167 to release the pressing state on the flexible cable 400 until it leaves the flexible cable 400, so that the flexible cable 400 can be removed from the printed circuit board 500 for replacement.

Furthermore, the width of the limiting sleeve 169 is greater than the distance between the first motor 172 and the second motor 174. The height of the portion of the pressing head rod 167 exposed from the limiting sleeve 169 is equal to the thickness of the flexible cable 400. The pressing head rod 167 has enough distance to be accommodated in the storage cavity 171 during the rising process. Furthermore, the limiting sleeve 169 prevents the pressing head rod 167 from rising excessively driven by the first motor 172 and the second motor 174 causing the pressing head rod 167 to impact the guide rail 176 thus resulting in deformation or damage of the guide rail 176.

In addition, one or more suction cups 177 may be disposed on each of the side of the first positioning piece 162 facing towards the printed circuit board 500 and the side of the second positioning piece 163 facing towards the printed circuit board 500. The first positioning piece 162 and the second positioning piece 163 are each suction-connected to the printed circuit board 500 through the respective one or more suction cups 177.

In the process of actually using the pressing apparatus 160 to press the junction of the flexible cable 400 and the printed circuit board 500, the pressing apparatus 160 may first be aligned with the junction of the flexible cable 400 and the printed circuit board 500, the first positioning piece 162 and the second positioning piece 163 are placed on the printed circuit board 500, and the flexible cable 400 is placed between the first positioning piece 162 and the second positioning piece 163. Depending on the actual width of the flexible cable 400, the second positioning piece 163 is moved on the guide rail 176 so as to adjust the position of the second positioning piece 163 on the guide rail 176 so that the first positioning piece 162 and the second positioning piece 163 can just respectively press against both sides of the flexible cable 400 in the width direction, thus realizing a positioning of the flexible cable 400 in the horizontal direction. Then, the entire pressing apparatus 160 is pressed down. At this time, the one or more suction cups 177 on the side of the first positioning piece 162 facing towards the printed circuit board 500 and the one or more suction cups 177 on the side of the second positioning piece 163 facing towards the printed circuit board 500 are compressed, so that a negative pressure suction connection is formed between each suction cup 177 and the printed circuit board 500. In this way, the first positioning piece 162 and the second positioning piece 163 can be fixed to the printed circuit board 500, further enhancing the stability of the connection between the pressing apparatus 160 and the printed circuit board 500, so that the pressing apparatus 160 is not easily detached from the printed circuit board 500.

Figure 9:
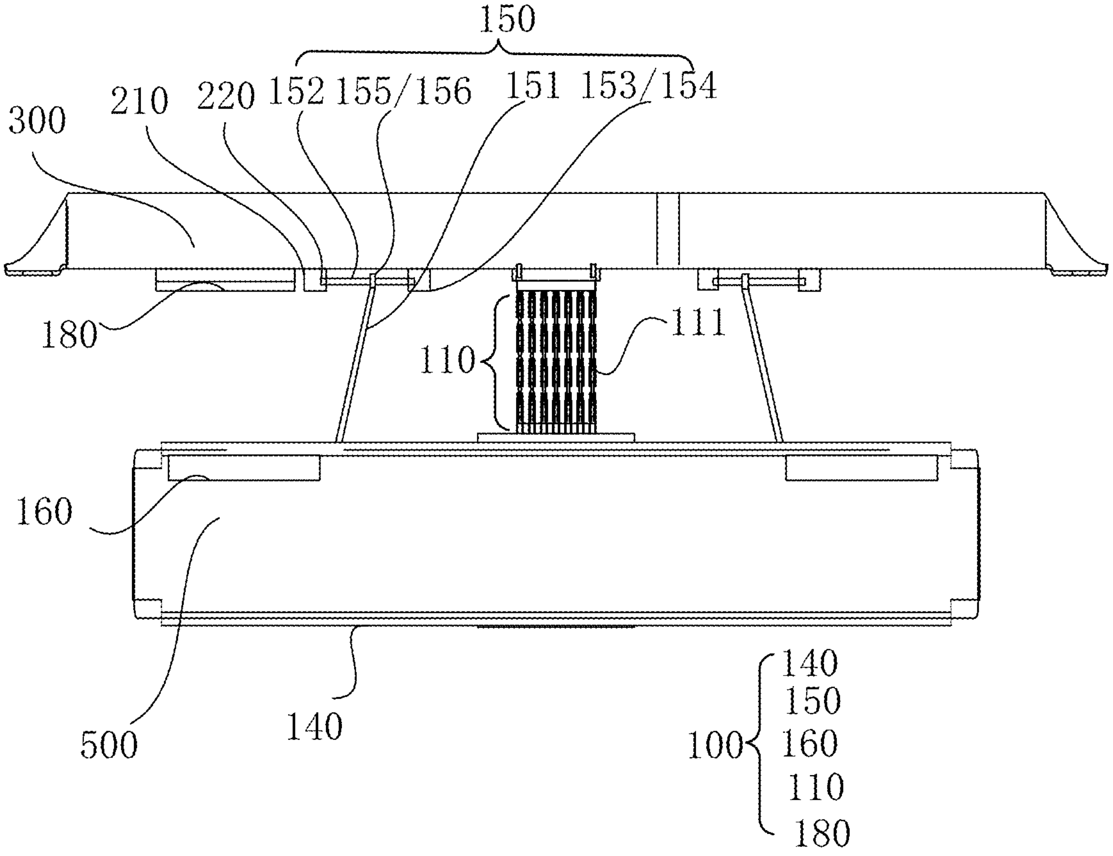
FIG. 9 is a schematic diagram of a fourth embodiment of the connection mechanism according to the present application.
Figure 10:
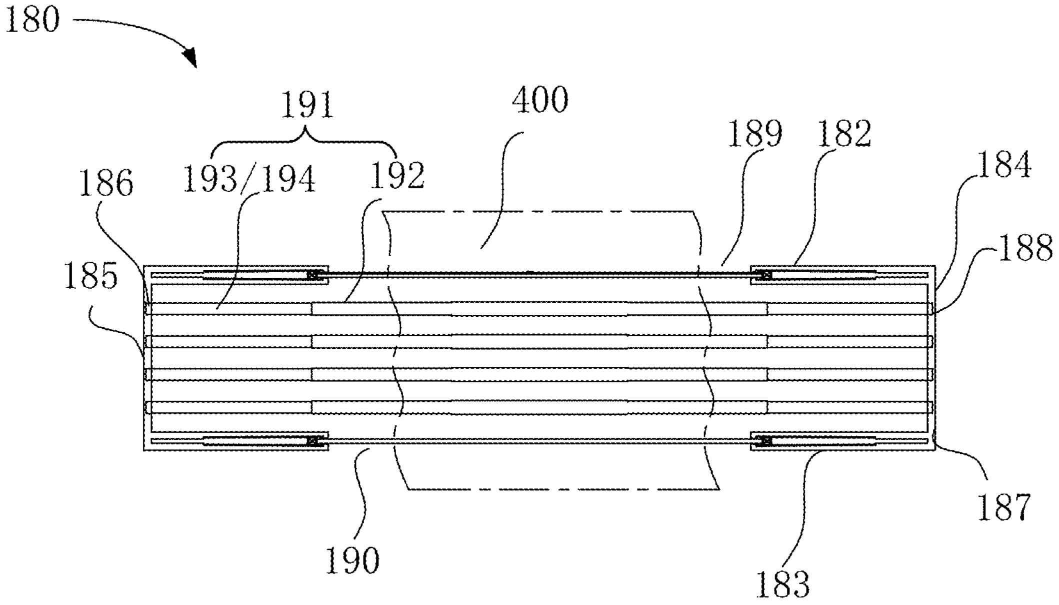
FIG. 10 is a schematic diagram of a receiving apparatus in the fourth embodiment of the connection mechanism according to the present application.
Figure 11:
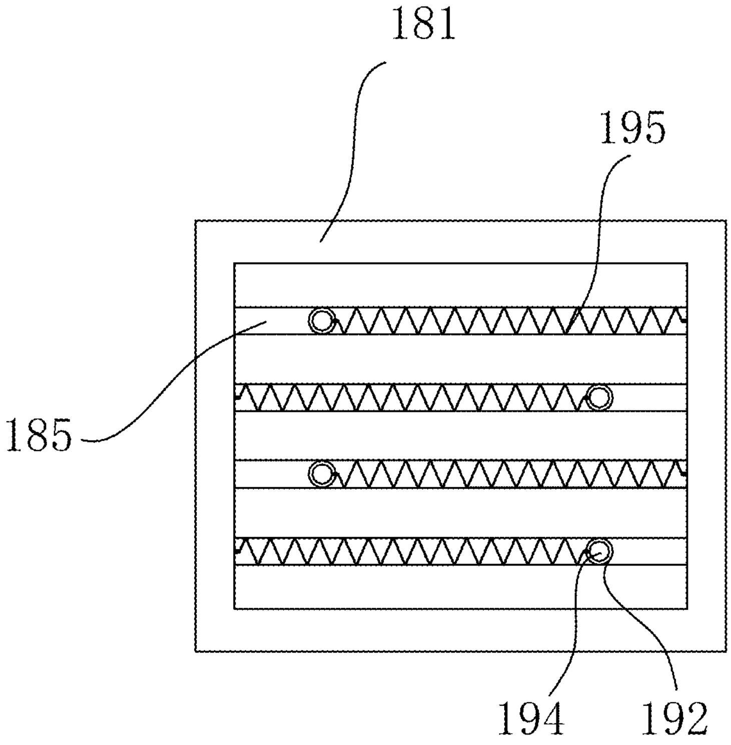
FIG. 11 is a side view of the receiving apparatus in the fourth embodiment of the connection mechanism according to the present application.
Figure 12:
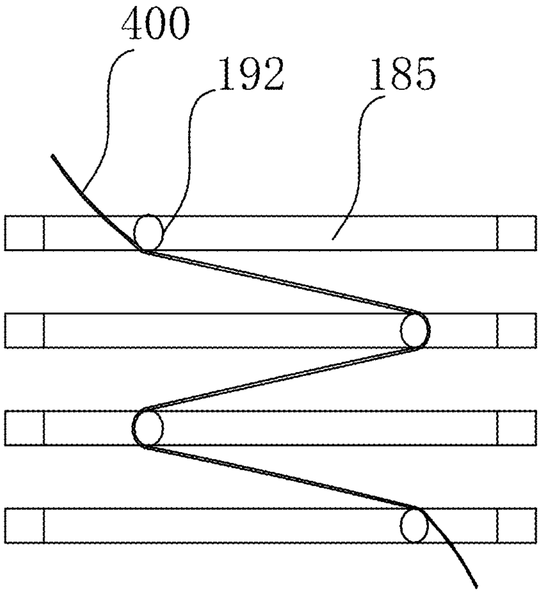
FIG. 12 is a side view of the receiving apparatus loading flexible cables in the fourth embodiment of the connection mechanism according to the present application.

FIG. 9 is a schematic diagram of a fourth embodiment of the connection mechanism according to the present application. FIG. 10 is a schematic diagram of a receiving apparatus in the fourth embodiment of the connection mechanism according to the present application. FIG. 11 is a side view of the receiving apparatus in the fourth embodiment of the connection mechanism according to the present application. FIG. 12 is a side view of the receiving apparatus loading flexible cables in the fourth embodiment of the connection mechanism according to the present application. The connection mechanism 100 further includes a receiving apparatus 180. The receiving apparatus 180 is disposed between the display panel 200 and the printed circuit board 500 and is connected to the back plate 300 for partially storing the flexible cable 400. The receiving apparatus 180 includes a casing 181 and an regulating assembly 191. The regulating assembly 191 is arranged in the casing 181. The casing 181 includes a top wall 182 and a bottom wall 183 that are arranged oppositely, and four side walls 184 surrounding the top wall 182 and the bottom wall 183. The top wall 182 includes a first opening 189. The bottom wall 183 includes a second opening 190. The first opening 189 faces towards the connecting device 110. The second opening 190 faces the securing device 140. One end of the flexible cable 400 extends outward from the first opening 189 and the other end extends outward from the second opening 190. The regulating assembly 191 includes a plurality of regulating pieces 192, an accommodating structure 193, and a plurality of first elastic pieces 195. The plurality of first elastic pieces 195 are arranged at intervals along the side wall 184 in the direction from the first opening 189 to the second opening 190. One end of one of two adjacent first elastic pieces 195 and one end of the other of the two adjacent first elastic pieces 195 are connected to two opposite side walls 184 respectively. The accommodating structure 193 is used to carry the regulating pieces 192. The other end of each first elastic piece 195 is connected to the respective regulating piece 192. The elastic extension and compression orientation of the first elastic piece 195 is perpendicular to the regulating piece 192. Each first elastic piece 195 drives the respective regulating piece 192 to move along the elastic extension and compression orientation of the first elastic piece 195. The length of the first elastic piece 195 in its natural state is greater than half of the width of the top wall 182 and the bottom wall 183, and the plurality of regulating pieces 192 are staggered along the direction of starting from the top wall 182 toward the bottom wall 183. The flexible cable 400 passes through the sides of the two adjacent regulating pieces 192 facing away from the respective first elastic pieces 195 in sequence.

When switching from a flat screen model to a curved screen model, the receiving apparatus 180 may be operated to leave a relatively long length of the flexible cable 400, the distance adjusting assembly 150 may be removed from the back plate 300, and the locking structures 111 may be utilized to drive the securing device 140 to be folded to the back of the back plate 300, and then the receiving apparatus 180 may be adjusted to ensure a suitable binding length between the flexible cable 400 and the printed circuit board 500. When the model is switched, the pressing apparatus 160 may not change the pressing state and keep pressing the flexible cable 400 on the printed circuit board 500.

During the adjustment of the securing device 140, since the distance between the printed circuit board 500 and the display panel 200 changes, the length of the flexible cable 400 is adjusted through the regulating assembly 191 in the receiving apparatus 180 to adapt to changes in the distance between the printed circuit board 500 and the display panel 200. In this way, it can adapt to the junction of the printed circuit board 500 and the back plate 300 of different models without affecting the connection between the flexible cable 400 and the printed circuit board 500, thereby improving product applicability.

During the process of loading the flexible cable 400 into the receiving apparatus 180, one end of the flexible cable 400 may first be passed in through the first opening 189 of the casing 181, then passed through the side of each regulating piece 192 facing away from the respective first elastic piece 195 in sequence, and finally passed outward through the second opening 190 of the casing 181, so that the part of the flexible cable 400 inside the casing 181 forms a zigzag shape. This allows a relatively long part of the flexible cable 400 to be accommodated in the receiving apparatus 180 in preparation for being pulled out or contracted to change the length of the flexible cable 400 depending on actual usage conditions. Since when the regulating piece 192 contacts the flexible cable 400, under the elastic action of the first elastic piece 195, a force is exerted on the flexible cable 400 in a direction of pushing the flexible cable 400 away from the first elastic piece 195, and the flexible cable 400 may exert a relative squeezing force on the regulating piece 192, causing the flexible cable 400 to be straightened between the multiple regulating pieces 192. When the securing device 140 is folded to the back of the back plate 300 for fixation so that a relatively long flexible cable 400 is needed, then one end of the flexible cable 400 may be stretched outward. When the securing device 140 is installed parallel to the back plate 300, the flexible cable 400 may be directly stored in the casing 181 if it is too long.

The regulating piece 192 is a tubular structure. The side wall 184 includes a first side wall 185 and a second side wall 187 opposite to each other. The first side wall 185 and the second side wall 187 are respectively located on both sides of the regulating piece 192 in the length. The first side wall 185 has a plurality of first slide grooves 186 disposed at intervals in a direction from the first opening 189 to the second opening 190. The second side wall 187 has a plurality of second slide grooves 188 disposed at intervals in a direction from the first opening 189 to the second opening 190. The positions of the first slide grooves 186 are disposed in one-to-one correspondence with the positions of the second slide grooves 188. Both the first slide grooves 186 and the second slide grooves 188 are of an elongated shape. The direction of extension of each first slide groove 186 and each second slide groove 188 is identical with the elastic extension and compression orientation of each first elastic piece 195. The accommodating structure 193 includes a plurality of bearings 194. Both ends of each bearing 194 are respectively embedded in the first slide groove 186 and the second slide groove 188 disposed on the same layer, and the bearing 194 can move along the direction of extension of the first slide groove 186 and the second slide groove 188. Each regulating piece 192 is sleeved on the respective bearing 194.

That is, a plurality of first slide grooves 186 and a plurality of second slide grooves 188 are respectively defined in the first side wall 185 and the second side wall 187, and both ends of each bearing 194 are embedded in the respective first slide groove 186 and respective second slide groove 188, so that the first side wall 185 and the second side wall 187 stably support the bearings 194 through the first slide grooves 186 and the second slide grooves 188, and each bearing 194 is enabled to move along the direction of extension of the respective first slide groove 186 and the respective second slide groove 188. Since the direction of extension of the first slide groove 186 and the second slide groove 188 is identical with the elastic extension and compression orientation of the spring, when the regulating piece 192 is sleeved on the bearing 194, during the extension or compression process of the spring, the regulating piece 192 is driven to move, and the bearing 194 is driven to follow the regulating piece 192 to move along the extension and compression orientation of the spring. In addition, the bearings 194 are used to support the regulating pieces 192 so that the regulating pieces 192 are not easily deformed during movement, thereby maintaining the structural stability of the regulating pieces 192.

Figure 13:
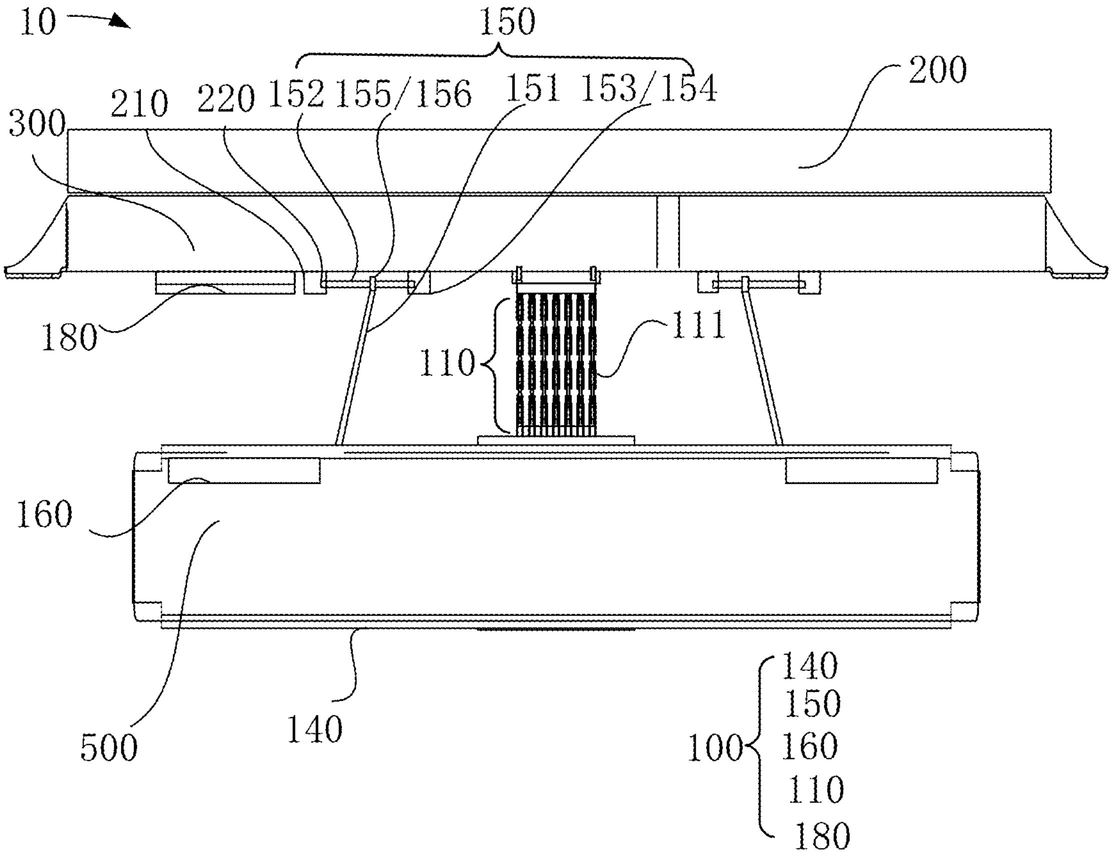
FIG. 13 is a schematic diagram of an embodiment of a display device according to the present application.

FIG. 13 is a schematic diagram of an embodiment of a display device according to the present application. As illustrated in FIG. 13, this application further discloses a display device 10, including a display panel 200, a back plate 300, a printed circuit board 500, and a flexible cable 400. The back plate 300 wraps up the display panel 200. One side of the flexible cable 400 is connected to the display panel 200 and the other side is connected to the printed circuit board 500. The display device 10 further includes the above-mentioned connection mechanism 100. The connection mechanism 100 connects the printed circuit board 500 to the back plate 300 and the display panel 200.

The display panel 200 may be connected to the printed circuit board 500 through a flexible cable 400. The printed circuit board 500 provides driving signals to the display panel 200. After the printed circuit board 500 is connected from the display panel 200, it needs to be fixed up. First, the printed circuit board 500 and the connection mechanism 100 are fixed to each other. Then the printed circuit board 500 is connected and fixed to the back plate 300 using the connection mechanism 100, so that the printed circuit board 500 is stably held in position and is not prone to shaking or falling off, and thus can provide stable signal output for the display panel 200 to ensure the quality of the display device 10.

The typical connection mechanism 100 is designed for a specific type of display device 10, and its position is fixed and cannot be adjusted. Therefore, when fixing up the printed circuit board 500 in different types of display devices 10, the same connection mechanism 100 cannot be repeatedly used, which increases the complexity of assembly and increases the assembly costs.

In view of the above problems, this application improves the connection mechanism 100 used to connect the printed circuit board 500 and the back plate 300 in the display device 10. First, the printed circuit board 500 is fixed to the connection mechanism 100 using the securing device 140 in the connection mechanism 100 to prevent the printed circuit board 500 from shaking thereby ensuring the stability of the connection of the printed circuit board 500. Then, the printed circuit board 500 and the back plate 300 are connected through the connecting device 110. The connecting device 110 is a chain structure formed by connecting a plurality of locking structures 111 end to end. The plurality of locking structures 111 are operative to rotate relative to each other so that the position of the entire connecting device 110 can be adjusted relative to of the back plate 300. As such, depending on different types of display devices 10, the securing device 140 may be driven to be oriented parallel to the back plate 300 or folded to the back of the back plate 300 to realize switching of different connection methods between the back plate 300 and the printed circuit board 500, thereby improving product applicability and further improving the quality of the display device 10.

It should be noted that the inventive concept of the present application can be formed into many embodiments, but the length of the application document is limited and so these embodiments cannot be enumerated one by one. The technical features can be arbitrarily combined to form a new embodiment, and the original technical effect may be enhanced after the various embodiments or technical features are combined.

The foregoing description is merely a further detailed description of the present application made with reference to some specific illustrative embodiments, and the specific implementations of the present application will not be construed to be limited to these illustrative embodiments. For those having ordinary skill in the technical field to which this application pertains, numerous simple deductions or substitutions may be made without departing from the concept of this application, which shall all be regarded as falling in the scope of protection of this application.

What is claimed is:

1. A connection mechanism for connecting a printed circuit board and a back plate, the connection mechanism comprising a connecting device and a securing device; wherein one side of the connecting device is connected to the back plate, and wherein another side of the connecting device is connected to the securing device; wherein the securing device is used to fix up the printed circuit board;

wherein the connecting device comprises a plurality of locking structures that are connected end to end, wherein the plurality of locking structures are operative to rotate relative to each other thus driving the securing device to be oriented parallel to the back plate or be folded to a back of the back plate;

wherein each of the plurality of locking structures comprises a locking housing and a rotating piece disposed in the locking housing, wherein the rotating piece comprises a rotating body and a connecting plate, wherein the rotating body and the locking housing are both cylindrical, wherein one side of the connecting plate is connected to an exterior of the rotating body;

wherein the plurality of locking structures comprise a first locking structure and a second locking structure that are adjacently arranged; wherein in the first locking structure, the locking housing of the first locking structure defines a first through-slot corresponding to a position of the connecting plate; wherein the one side of the connecting plate is connected to the exterior of the rotating body, and wherein another side of the connecting plate extends outward from the first through-slot; wherein the connecting plate in the first locking structure is operative to rotate along a slotting direction of the first through-slot;

wherein in the second locking structure, the locking housing of the second locking structure further defines a second through-slot corresponding to the position of the connecting plate of the first locking structure; wherein the connecting plate of the first locking structure extends into the second through-slot and is rotatably connected to the locking housing of the second through-slot; wherein the connecting plate of the first locking structure is operative to rotate along a slotting direction of the second through-slot.

2. The connection mechanism as recited in claim 1, wherein an angle of rotation of the connecting plate is greater than or equal to 90°.

3. The connection mechanism as recited in claim 1, wherein the connecting plate of the first locking structure is operative to rotate at an angle greater than or equal to 90° in the second through-slot.

4. The connection mechanism as recited in claim 1, wherein there is disposed a movable assembly between the first locking structure and the second locking structure; wherein the movable assembly is arranged in the locking housing of the second locking structure, wherein the movable assembly comprises an electromagnet, an elastic piece, and a stopper piece; wherein the electromagnet is arranged adjacent to the connecting plate of the first locking structure; wherein two ends of the electromagnet each comprise a rotating shaft, and the locking housing of the second locking structure defines a rotating shaft hole corresponding to a position of each rotating shaft, wherein each rotating shaft is inserted into the respective rotating shaft hole thus rotatably connecting the electromagnet to the locking housing of the second locking structure;

wherein the connecting plate of the first locking structure passes through the second through-slot and is connected to one side of the electromagnet; wherein another side of the electromagnet is connected to one end of the elastic piece, and wherein another end of the elastic piece is connected to the stopper piece;

wherein the stopper piece is magnetic; wherein in response to the electromagnet being powered off, the electromagnet is operative to repel the stopper piece so that the stopper piece is engaged with the rotating body in the second locking structure; and wherein in response to the electromagnet being energized, the electromagnet is operative to attract the stopper piece so that the stopper piece is separated from the rotating body in the second locking structure.

5. The connection mechanism as recited in claim 4, wherein each stopper piece comprises a protruding bar on each of both sides, wherein the locking housing of the second locking structure comprises a slide groove disposed at a position corresponding to each protruding bare; wherein each protruding bar is embedded in the respective slide groove and is operative to slide along a direction of extension of the respective slide groove.

6. The connection mechanism as recited in claim 4, further comprising a distance adjusting assembly, wherein one side of the distance adjusting assembly is connected to the back plate, and wherein another side of the distance adjusting assembly is connected to the securing device;

wherein the distance adjusting assembly comprises a connecting rod, a distance adjusting shaft, and a control device; wherein one end of the distance adjusting shaft is connected to the back plate, and another end is connected to the control device; wherein the distance adjusting shaft is oriented parallel to the securing device, wherein there is disposed a movable piece that is sleeved on the distance adjusting shaft, wherein the control device is used to control the movable piece to move along a direction of extension of the distance adjusting shaft;

wherein the connecting rod is arranged between the distance adjusting shaft and the securing device;

wherein one end of the connecting rod is connected to the movable piece, and wherein another end of the connecting rod is connected to the securing device.

7. The connection mechanism as recited in claim 6, wherein the control device is a motor, wherein the other end of the distance adjusting shaft is connected to a rotating shaft of the motor; wherein the movable piece is a screw nut, wherein the motor is used to drive the distance adjusting shaft to rotate and accordingly control the screw nut to move along the direction of extension of the distance adjusting shaft.

8. The connection mechanism as recited in claim 7, wherein there is disposed a fixing piece on a side of the back plate facing towards the securing device, wherein there is defined a first rotating shaft hole in the fixing piece, wherein a direction of extension of the first rotating shaft hole is oriented parallel to the securing device.

9. The connection mechanism as recited in claim 8, wherein the securing device and the back plate are separated by a distance that lies in the range of 0.5 mm to 2 mm.

10. A connection mechanism for connecting a printed circuit board and a back plate, the connection mechanism comprising a connecting device and a securing device; wherein one side of the connecting device is connected to the back plate, and wherein another side of the connecting device is connected to the securing device; wherein the securing device is used to fix up the printed circuit board;

wherein the connecting device comprises a plurality of locking structures that are connected end to end, wherein the plurality of locking structures are operative to rotate relative to each other thus driving the securing device to be oriented parallel to the back plate or be folded to a back of the back plate;

the connection mechanism further comprising a pressing apparatus mounted on the printed circuit board; wherein the pressing apparatus comprises a positioning device, a pressing device, and a guide rail; wherein the positioning device is connected to a side of the guide rail facing towards the printed circuit board; wherein a direction of extension of the guide rail is consistent with a width direction of the flexible cable; wherein the pressing device is sleeved on the guide rail and is operative to move along the direction of extension of the guide rail, and is used to press a junction of the printed circuit board and the flexible cable.

11. The connection mechanism as recited in claim 10, wherein the pressing device comprises a pressing head assembly and a base, the base being sleeved on the guide rail; wherein the positioning device comprises a first positioning piece and a second positioning piece; wherein the first positioning piece and the second positioning piece are respectively arranged on both sides of the guide rail, and wherein the second positioning piece is movably connected to the guide rail and is operative to move along the direction of extension of the guide rail; wherein a side of the first positioning piece and a side of the second positioning piece facing away from the guide rail are each detachably connected to the printed circuit board, and wherein the first positioning piece and the second positioning piece respectively abut against both sides of the flexible cable in the width direction of the flexible cable.

12. The connection mechanism as recited in claim 11, wherein the pressing head assembly comprises a pressing head, a pressing head rod, and a limiting sleeve; wherein one end of the pressing head rod passes through the limiting sleeve, is connected to the pressing head, and is partially exposed from the limiting sleeve; wherein a side of the limiting sleeve facing away from the base is connected to the pressing head;

wherein the pressing head rod is operative to drive the pressing head to reciprocate in a direction perpendicular to the printed circuit board.

13. The connection mechanism as recited in claim 12, wherein there is defined a storage cavity in a side of the base facing towards the printed circuit board; wherein there is disposed in the storage cavity a first motor and a second motor that are arranged at intervals along a horizontal direction; wherein the pressing head rod is arranged between the first motor and the second motor; wherein the first electric motor comprises a first electric gear, the second motor comprises a second electric gear; wherein a part of the pressing head rod that is exposed from the limiting sleeve comprises a plurality of rack teeth on side walls facing towards the first motor and the second motor; wherein the plurality of rack teeth are respectively connected to the first electric gear and the second electric gear.

14. The connection mechanism as recited in claim 13, wherein a width of the limiting sleeve is greater than a distance between the first motor and the second motor, wherein a height of the part of the pressing head rod that is exposed from the limiting sleeve is equal to a thickness of the flexible cable.

15. The connection mechanism as recited in claim 11, wherein there is arranged one or more suction cups on each of a side of the first positioning piece and a side of the second positioning piece facing towards the printed circuit board; wherein the first positioning piece and the second positioning piece are each suction-connected to the printed circuit board through the respective one or more suction cups.

16. The connection mechanism as recited in claim 10, wherein the securing device comprises a first clamping plate and a second clamping plate that are spaced apart from each other; wherein the first clamping plate and the second clamping plate are operative to clamp the printed circuit board from both sides in a width direction of the printed circuit board.

17. A display device, comprising a display panel, a back plate, a printed circuit board, and a flexible cable; wherein the back plate is used to wrap up the display panel; wherein one side of the flexible cable is connected to the display panel, and wherein another side of the flexible cable is connected to the printed circuit board;

wherein the display device further comprises a connection mechanism, wherein the connection mechanism is operative to connect the printed circuit board to the back plate and the display panel; wherein the connection mechanism comprises a connecting device and a securing device; wherein one side of the connecting device is connected to the back plate, and wherein another side of the connecting device is connected to the securing device; wherein the securing device is used to fix up the printed circuit board;

wherein the connecting device comprises a plurality of locking structures that are connected end to end, wherein the plurality of locking structures are operative to rotate relative to each other thus driving the securing device to be oriented parallel to the back plate or be folded to a back of the back plate;

the connection mechanism further comprising a receiving apparatus connected to the back plate, the receiving apparatus comprising a casing and an regulating assembly; wherein the casing has a first opening and a second opening oppositely disposed, wherein the regulating assembly is disposed in the casing;

wherein the regulating assembly comprises a plurality of regulating pieces, an accommodating structure, and a plurality of first elastic pieces; wherein the accommodating structure is connected to the casing and used to carry each of the plurality of regulating pieces; wherein the plurality of first elastic pieces are arranged at intervals in the casing in a direction from the first opening to the second opening, wherein one end of one of two adjacent first elastic pieces and one end of the other of the two adjacent first elastic pieces are respectively connected to two opposite side walls of the casing; wherein another end of each first elastic piece is connected to the respective regulating piece; wherein an elastic extension and compression orientation of each first elastic piece is perpendicular to the respective regulating piece, wherein the first elastic piece is operative to drive the respective regulating piece to be movable along the elastic extension and compression orientation of the first elastic piece; wherein the plurality of regulating pieces are staggered in a direction from the first opening toward the second opening; wherein the flexible cable passes through a side of each of every two adjacent regulating pieces facing away from the respective first elastic piece in sequence, and wherein two ends of the flexible cable extend outward from the first opening and the second opening respectively.

18. The connection mechanism as recited in claim 17, wherein each regulating piece is of a tubular structure; wherein side walls of the casing comprise a first side wall and a second side wall opposite to each other, wherein the first side wall and the second side wall are respectively disposed on both sides of each regulating piece in a length direction of the regulating piece; wherein the first side wall comprises a plurality of first slide grooves disposed at intervals in the direction from the first opening to the second opening, wherein the second side wall comprises a plurality of second slide grooves disposed at intervals in the direction from the first opening to the second opening; wherein positions of the plurality of first slide grooves are disposed in one-to-one correspondence with positions of the plurality of second slide grooves; wherein the plurality of first slide grooves and the plurality of second slide grooves are each elongated; wherein a direction of extension of each of the plurality of first slide grooves and each of the plurality of second slide grooves is identical with an elastic extension and compression orientation of each of the plurality of first elastic pieces; wherein the accommodating structure comprises a plurality of bearings; wherein both ends of each bearing are respectively embedded in the respective first slide groove and the respective second slide groove that are disposed on a same layer and wherein each bearing is operative to move along the direction of extension of the respective first slide groove and the respective second slide groove; wherein each regulating piece is sleeved on the respective bearing.

* * * * *